United States Patent [19]

Sugawara et al.

[11] Patent Number: 5,687,134
[45] Date of Patent: Nov. 11, 1997

[54] SYNCHRONOUS SEMICONDUCTOR MEMORY CAPABLE OF SAVING A LATENCY WITH A REDUCED CIRCUIT SCALE

[75] Inventors: Michinori Sugawara; Manabu Kawaguchi, both of Tokyo, Japan

[73] Assignee: NEC Corporation, Tokyo, Japan

[21] Appl. No.: 734,082

[22] Filed: Oct. 21, 1996

[30] Foreign Application Priority Data

Oct. 20, 1995 [JP] Japan .................................. 7-297885

[51] Int. Cl.⁶ .................................................. G11C 8/00
[52] U.S. Cl. ............................... 365/233; 365/189.05
[58] Field of Search .......................... 365/233, 189.05, 365/191, 194, 230.08

[56] References Cited

U.S. PATENT DOCUMENTS

| | | | |
|---|---|---|---|
| 5,083,296 | 1/1992 | Hara | 365/230.02 |
| 5,341,341 | 8/1994 | Fukuzo | 365/233 |
| 5,566,108 | 10/1996 | Kitamura | 365/233 |
| 5,579,267 | 11/1996 | Koshikawa | 365/189.05 |

FOREIGN PATENT DOCUMENTS

3-122895  5/1991  Japan .

*Primary Examiner*—David C. Nelms
*Assistant Examiner*—Son Mai
*Attorney, Agent, or Firm*—Foley & Lardner

[57] ABSTRACT

In a synchronous semiconductor memory having a memory section (MS) for memorizing a particular datum, a single output latch circuit (32) is connected to an output side of the memory section and controlled by the use of a pulse signal whether or not the particular datum is passed through the output latch circuit. The pulse signal is produced in a pulse generator (31) to synchronize with an internal clock signal which is produced in an internal clock signal producing arrangement (21 and 22). The pulse signal has a pulse width which is independent of the internal clock signal and determined dependent on a timing when the memory section outputs the particular datum.

6 Claims, 5 Drawing Sheets

SYNCHRONOUS SEMICONDUCTOR MEMORY CAPABLE OF SAVING A LATENCY WITH A REDUCED CIRCUIT SCALE

BACKGROUND OF THE INVENTION

This invention relates to a synchronous semiconductor memory having an input and an output section each of which perform a register operation.

Such a synchronous semiconductor memory is operable in synchronism with an input timing signal or a clock signal and is suitable as a high-speed bulk memory in view of the reduction in power consumption and the increase in operation speed.

A conventional synchronous semiconductor memory of the type is disclosed in Japanese Prepublication (Kokai or Publication of Unexamined Patent Application) No. 122895/1991 and comprises a memory section for memorizing a particular datum, an input section for inputting the particular datum to the memory section, an output section for outputting the particular datum from the memory section, and control means responsive to a clock signal for synchronously controlling operation of each of the input and the output sections.

In the manner which will far later be described in conjunction with the drawing, the conventional synchronous semiconductor memory has a cycle time and a clock access time. Typically, a sum of the cycle time and the clock access time is desired to be as small as possible. The conventional synchronous semiconductor memory is advantageous in that the sum includes a timing margin for securing a setup time of the output section.

However, the timing margin is a latency or an idle time and is time-consuming in view of efficiency in data transmission.

SUMMARY OF THE INVENTION

It is therefore an object of this invention to provide a synchronous semiconductor memory which is capable of saving a latency with a reduced circuit scale.

It is another object of this invention to provide a synchronous semiconductor memory of the described, which is capable of decreasing a sum of a cycle time and a clock access time.

It is still another object of this invention to provide a synchronous semiconductor memory of the described, which is capable of forming an output section thereof within a relatively narrow area of a memory chip.

Other objects of this invention will become clear as the description proceeds.

According to an aspect of this invention, there is provided a synchronous semiconductor memory including a memory section for memorizing a particular datum, an input section for inputting the particular datum to the memory section, an output section for outputting the particular datum from the memory section, and control means responsive to an external clock signal for synchronously controlling operation of each of the input and the output sections. In the synchronous semiconductor memory, the control means comprises internal clock signal producing means responsive to said external clock signal for producing an internal clock signal delayed from said external clock signal, control signal producing means connected to the internal clock signal producing means and responsive to the internal clock signal for producing an input section control signal which is used in

2 controlling the operation of the input section, and pulse signal producing means connected to the clock signal producing means and responsive to the internal clock signal for producing a pulse signal synchronized with the internal clock signal, the pulse signal having a pulse width which is independent of the internal clock signal and which is determined dependent on a timing when the memory section outputs the particular datum. The the output section comprises a single output latch circuit which is connected to the memory section and the pulse signal producing means for controlling by the use of the pulse signal whether or not the particular datum is passed through the single output latch circuit.

DESCRIPTION OF THE PREFERRED EMBODIMENT

Figure 1:
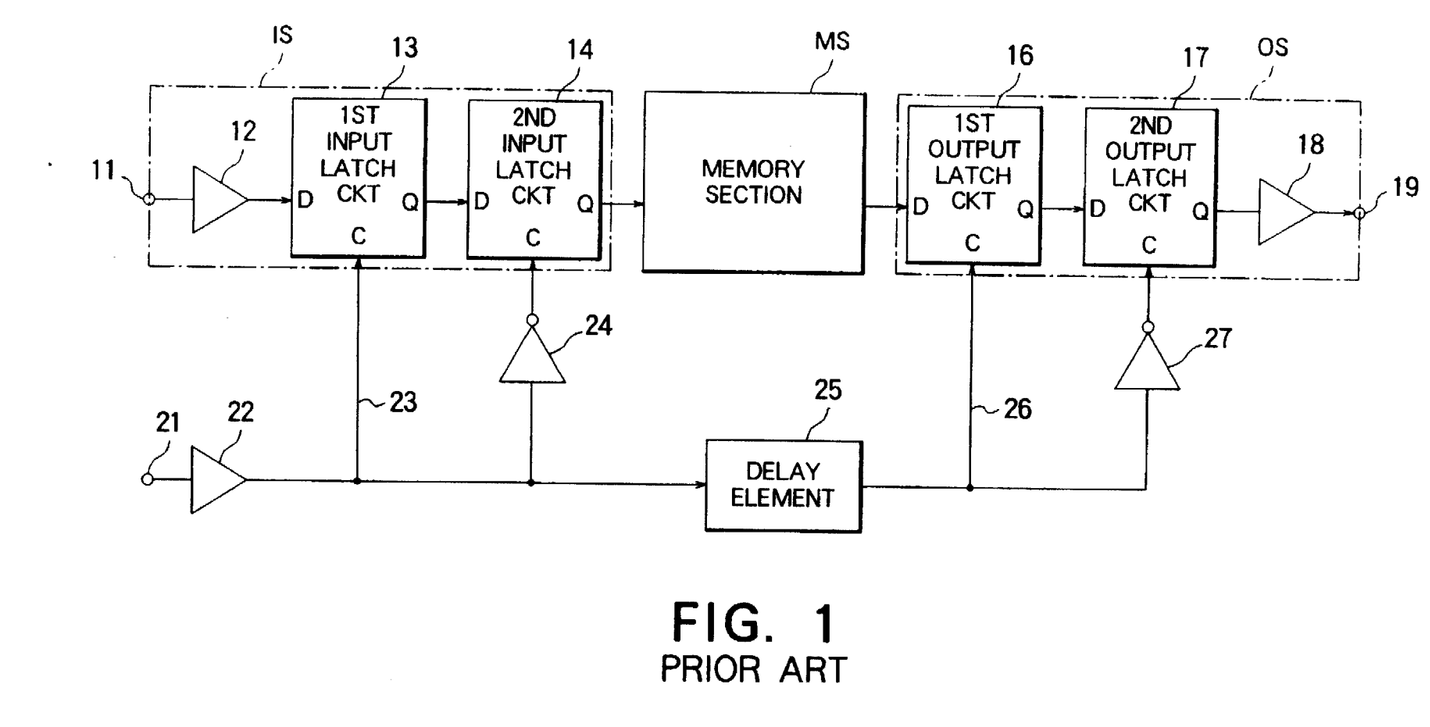
FIG. 1 is a block diagram of a conventional synchronous semiconductor memory.

Referring to FIG. 1, description will be made at first as regards a conventional synchronous semiconductor memory for a better understanding of this invention. The conventional synchronous semiconductor memory comprises, in a single semiconductor chip known in the art, a RAM (random access memory) circuit or a memory section MS for memorizing a particular datum, an input section IS connected to the memory section MS for inputting the particular datum to the memory section MS, an output section OS connected to the memory section MS for outputting the particular datum from the memory section MS, and a control section CS connected to the input and the output sections IS and OS and responsive to an external clock signal for synchronously controlling operation of each of the input and the output sections IS and OS. The external clock signal will later be described.

The input section IS comprises a data input terminal 11, an input buffer circuit 12, a first input latch circuit 13, and a second input latch circuit 14. The data input terminal 11 is for being supplied with an original datum known in the art. The input buffer circuit 12 is connected to the data input terminal 11 and is for processing the original datum into a buffered input datum which is delayed from the original datum. The first input latch circuit 13 is connected to the input buffer circuit 12 and is for controlling by the use of a first input control signal whether or not the buffered input datum is passed as a local input datum through the first input latch circuit 13. The second input latch circuit 14 is connected to the first input latch circuit 13 and is for controlling by the use of a second input control signal whether or not the local input datum is passed as the particular datum through the second input latch circuit 14. The first and the second input control signals are produced in the control section CS in the manner which will later be described.

The output section OS comprises a first output latch circuit 16, a second output latch circuit 17, an output buffer circuit 18, and a data output terminal 19. The first output latch circuit 16 is connected to the memory section MS and is for controlling by the use of a first output control signal whether or not the particular datum is passed as a first local output datum through the first output latch circuit 16. The second output latch circuit 17 is connected to the first output latch circuit 16 and is for controlling by the use of a second output control signal whether or not the first local output datum is passed as a second local output datum through the second output latch circuit 18. The first and the second output control signals are produced in the control section CS in the manner which will later be described. The output buffer circuit 18 is connected to the second output latch circuit 17 and is for processing the second local output datum into a buffered output datum which is delayed from the second local output datum. The data output terminal 19 is connected to the output buffer circuit 18 and is for outputting the buffered output datum.

In the manner which will presently be described, the control section CS comprises a clock signal input terminal 21, a clock buffer circuit 22, an input side control line 23, an input side inverting circuit 24, a delay element 25, an output side control line 26, and an output side inverting circuit 27.

The clock signal input terminal 21 is for being supplied with the external clock signal. The clock buffer circuit 22 is connected to the clock signal input terminal 21 and is for processing the external clock signal into an internal clock signal which is delayed from the external clock signal to synchronize with the buffered input datum.

The input side control line 23 is connected between the first input latch circuit 13 and the clock buffer circuit 22 and is for supplying the internal clock signal as the first input control signal to the first input latch circuit 13. The input side control line 23 will be referred to as a supplying arrangement. The input side inverting circuit 24 is connected between the second input latch circuit 14 and the clock buffer circuit 22 and is for inverting the internal clock signal in its polarity to produce the second input control signal that is supplied to the second input latch circuit 14.

The delay element 25 is connected to the clock buffer circuit 22 and is for giving a predetermined time delay to the internal clock signal to produce a delayed clock signal. The predetermined time delay may be given as a line delay without provision of the delay element 25.

The output side control line 26 is connected between the first output latch circuit 16 and the delay element 25 and is for supplying the delayed clock signal as the first output control signal to the first output latch circuit 16. The output side inverting circuit 27 is connected between the second output latch circuit 17 and the delay element 25 and is for inverting the delayed clock signal in its polarity to produce the second output control signal that is supplied to the second output latch circuit 17.

The first and the second input latch circuits 13 and 14 are operable in a master/slave fashion. Likewise, the first and the second output latch circuits 16 and 17 are operable in a master/slave fashion.

Figure 2:
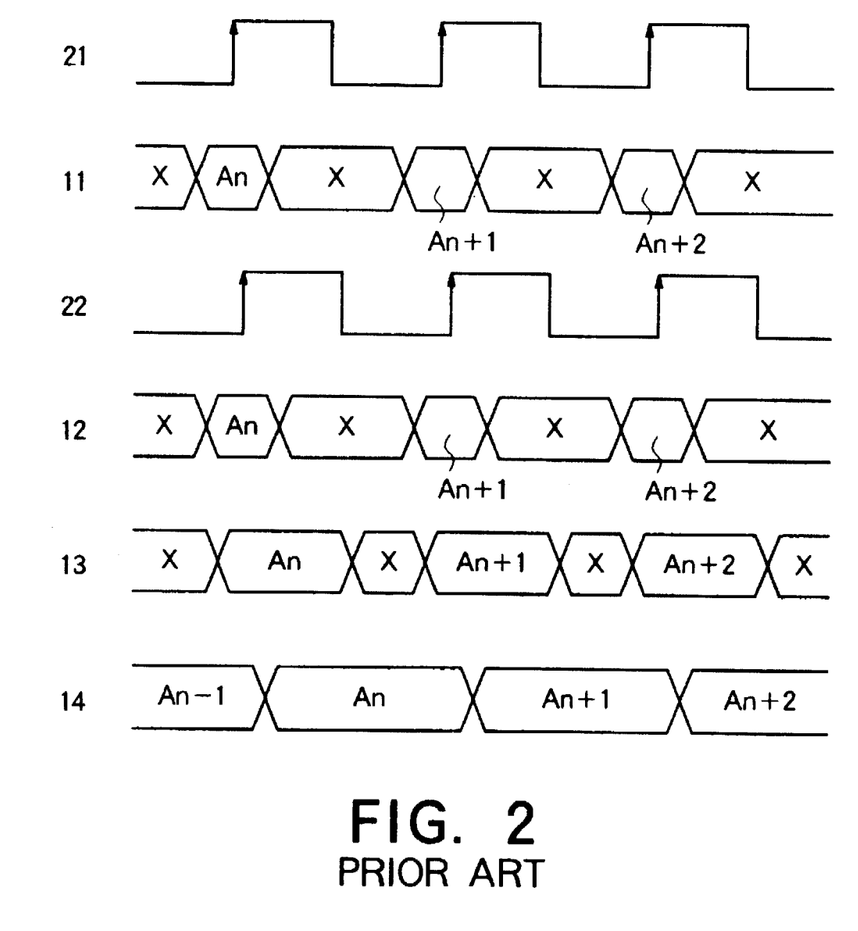
FIG. 2 is a timing chart for describing a register operation of an input section in the conventional synchronous semiconductor memory.

Now, an operation of the synchronous semiconductor memory illustrated in FIG. 1 will be described with reference to FIGS. 2 and 3 in addition. For convenience of the description, consideration will be directed to an address access operation upon reading data.

Each of the first input, each of the second input, the first output, the second output control signals has one of a high level and a low level. It is assumed here that the first input, the second input, the first output, the second output latch circuits 13, 14, 16, and 17 is operable in the following manner. When the first input control signal has the high level, the first input latch circuit 13 is put into a latching mode to latch the buffered input datum. When the first input control signal has the low level, the first input latch circuit 13 is put into a through mode to directly pass the buffered input datum to produce the local input datum. When the second input control signal has the high level, the second input latch circuit 14 is put into a latching mode to latch the local input datum. When the second input control signal has the low level, the second input latch circuit 14 is put into a through mode to directly pass the local input datum to produce the particular datum. When the first output control signal has the high level, the first output latch circuit 16 is put into a latching mode to latch the particular datum that is outputted from the memory section MS. When the first output control signal has the low level, the first output latch circuit 16 is put into a through mode to directly pass the particular datum to produce the first local output output datum. When the second output control signal has the high level, the second output latch circuit 17 is put into a latching mode to latch the first local output datum. When the second output control signal has the low level, the second output latch circuit 17 put into a through mode to directly pass the first local output datum to produce the second local output datum.

The description will be made as regards a data register operation in the input section. An input address signal $A_n$ is supplied as the buffered input signal to the first input latch circuit 13 through the data input terminal 11 and the input buffer 12. When the internal clock signal has a low level, the first input latch circuit 13 directly passes the input address signal $A_n$ which is then delivered as the local input datum from the first input latch circuit 13 to the second input latch circuit 14.

On the other hand, the second input latch circuit 14 is supplied with the first input control signal of the high level and is put in the latching mode. The second input latch circuit 14 then latches in input address signal $A_n$ supplied from the first input latch circuit 13. In other words, the input address signal $A_n$ is not delivered from the second input latch circuit 14 to the memory section MS. In this event, the second input latch circuit 14 holds, as a particular datum, a previous input address signal $A_{n-1}$ which is previous to the input address signal $A_n$.

Subsequently, when the internal clock signal is turned from a low level to the high level, the first latch circuit 13 is put into the latching mode. Whatever signal is supplied as the original datum through the data input terminal 11, the first input latch circuit 13 holds, as the local input datum, the input address signal $A_n$.

When the internal clock signal has the high level, the second input latch circuit 14 is supplied with, as the second input control signal, an inverted input side clock signal which is inverted from the internal clock signal in the input side inverting circuit 24. The second input latch circuit 14 is then put into the through mode to transmit the input address signal $A_n$ towards the memory section MS.

A delay time interval between the external clock signal and the internal clock signal is designed to be substantially equal to that between the original datum and the buffered input datum. As a consequence, the input address signal $A_n$ is transmitted to the memory section MS only when the external clock signal is turned from the low level to the high level.

In the output section, the similar register operation is carried out by the first and the second output latch circuits 16 and 17 with respect to the delayed clock signal.

Next, the description will be directed to an overall operation of the synchronous semiconductor memory.

Figure 3:
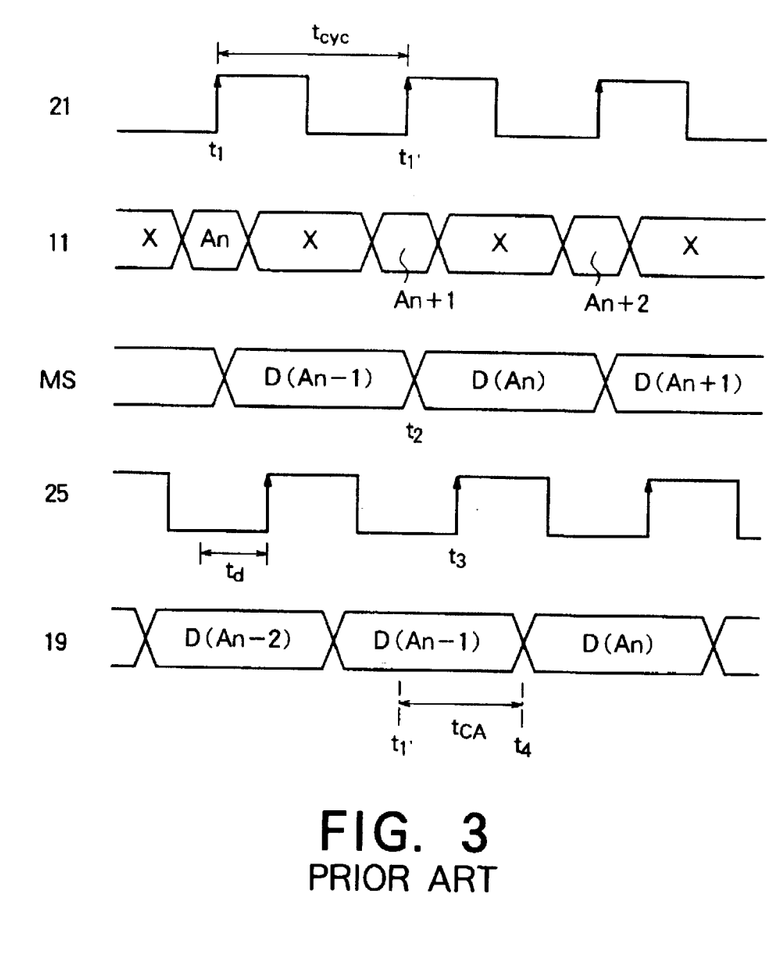
FIG. 3 is a timing chart for describing a signal transmit operation in the conventional synchronous semiconductor memory.

Referring to FIGS. 1 and 3, it is assumed that a datum $D(A_n)$ is stored in an address of the memory section MS which is defined by the input address signal $A_n$. When the external clock signal rises from the low level to the high level at a time instant t1, the input address signal $A_n$ is transmitted to the memory section MS in the manner which is described above. In accordance with the input address signal $A_n$, the datum $D(A_n)$ is read from the memory section MS and delivered as the particular datum to the first output latch circuit 16 at a time instant t2.

When the delayed clock signal has a low level, the particular datum passes through the first output latch circuit 16 to be supplied as the first local output datum to the second output latch circuit 17.

Subsequently, the delayed clock signal rises from the low level to a high level at a time instant t3. In this event, the datum $D(A_n)$ is made to pass through the second output latch circuit 17 and the output buffer circuit 18 and then delivered to the data output terminal 19 at a time instant t4.

Herein, the description will be directed to the relationship of various time intervals and time instants. The external clock signal has a cycle time. The synchronous semiconductor memory has a clock access time known in the art.

Let the cycle time and the clock access time be represented by tcyc and tca, respectively. As illustrated in FIG. 3, the cycle time tcyc and the clock access time tca are given by:

$$tcyc = t1' - t1 \quad (1)$$

and $$tca = t4 - t1'. \quad (2)$$

Time intervals between the time instants t1, t2, t3, and t4 are defined by:

$$t12 = t2 - t1, \quad (3)$$

$$t23 = t3 - t2, \quad (4)$$

and $$t34 = t4 - t3. \quad (5)$$

In this event, the following equation is given with reference to FIG. 3.

$$tcyc + tca = t12 + t23 + t34 \quad (6)$$

Each term in a right side of Equation (6) is interpreted as follows.

The time interval t12 is an address access time of the memory section MS. The time interval t23 is a timing margin for securing a setup time required for the first output latch circuit 16 to latch the data. The time interval t34 is a delay time interval at the second output latch circuit 17 and the output buffer circuit 18.

The timing margin t23 must be designed to be greater than a minimum setup time of the first output latch circuit 16. Practically, a considerably great value is selected for tolerance. The timing margin t23 is determined by a delay time interval td by the delay element 25.

For example, the values of tcyc, tca, t12, t23, t34, and td are selected to be equal to 7 ns, 3 ns, 6 ns, 2 ns, 2 ns, and 1 ns, respectively.

In this event, the timing margin t23 (2 ns) occupies 20% of the sum (=t12+t23+t34) which is equal to 10ns.

Figure 4:
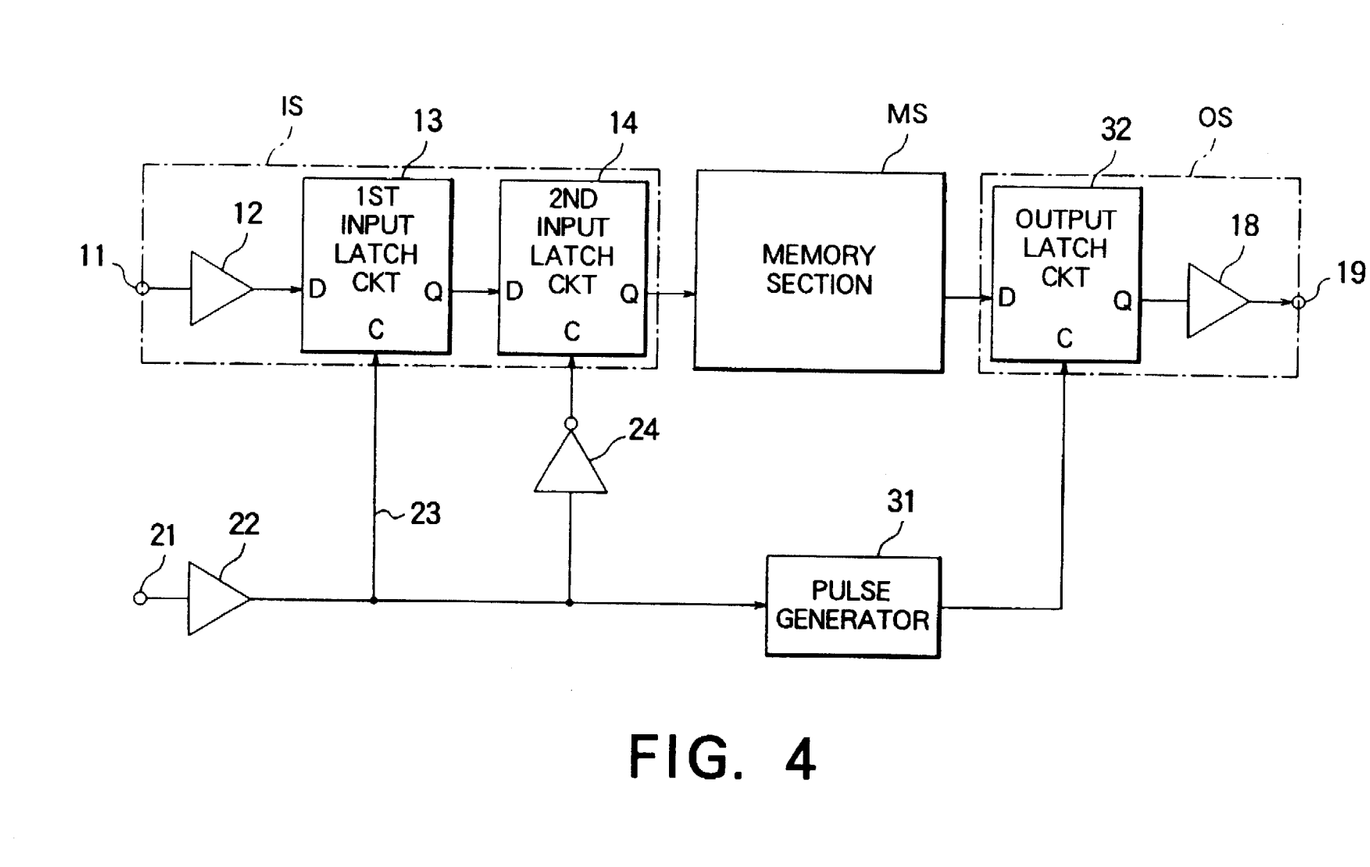
FIG. 4 is a block diagram of a synchronous semiconductor memory according to an embodiment of this invention.
Figure 5:
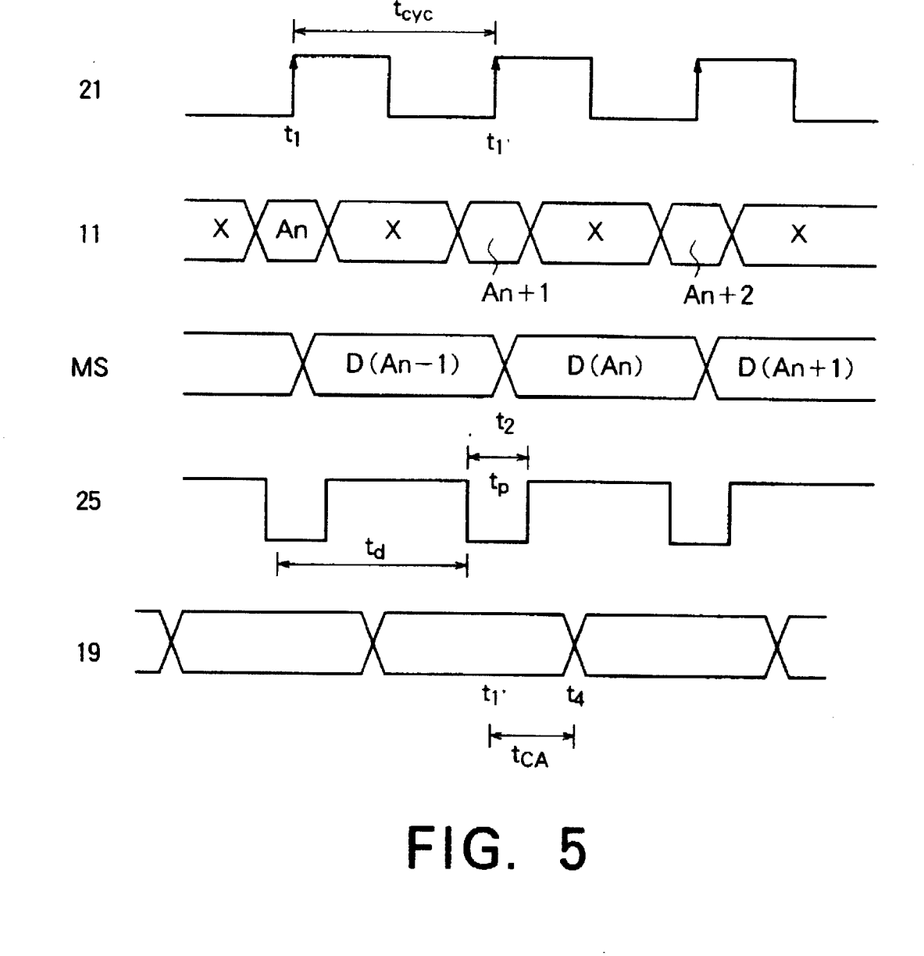
FIG. 5 is a timing chart for describing an operation of the synchronous semiconductor memory illustrated in FIG. 4.

Referring to FIG. 4 next, the description will be made as regards a synchronous semiconductor memory according to an embodiment of this invention. The synchronous semiconductor memory can be made on a single semiconductor chip and comprises similar parts designated by like reference numerals.

The synchronous semiconductor memory further comprises a pulse generator 31 and a single output latch circuit 32. The pulse generator 31 is connected to the clock buffer circuit 22 and is for producing a pulse signal in response to the internal clock signal. The pulse signal is synchronized with the internal clock signal and has a pulse width which is independent of the internal clock signal and which is determined dependent on a timing when the memory section MS outputs the particular datum. The pulse generator 31 is referred to as a pulse signal producing arrangement.

The output latch circuit 32 is connected to the memory section MS and the pulse generator 31 and is for controlling by the use of the pulse signal whether or not the particular datum is passed as a local output datum through the output latch circuit 32. The output buffer circuit 18 is connected directly to the single output latch circuit 32 and processes the local output datum into the buffered output datum that is outputted through the the data output terminal 19.

In the synchronous semiconductor memory, a combination of the clock signal input terminal 21 and the clock buffer 22 is referred to as an internal clock signal producing arrangement. A combination of the input side control line 23 and the input side inverting circuit 24 is referred to as a control signal producing arrangement. Each of the input and the output sections IS and OS is of a register type.

Referring to FIG. 4 together with FIG. 3, the description will now be directed to an operation of the synchronous semiconductor memory. Since the register operation in the input section IS is similar to that described in conjunction with the conventional synchronous semiconductor memory, description will not be made any longer. A register operation in the output section OS is carried out in the manner which will presently be described.

An address access operation upon reading data is similar to that of the conventional synchronous semiconductor memory until the particular datum is delivered to the first output latch circuit 16.

In the synchronous semiconductor memory, the pulse generator 31 is supplied with the internal clock signal and produces the pulse signal. The pulse signal comprises a series of pulses each of which has a pulse width tp and is delayed by a particular time interval td from the external clock signal. In other words, the pulse signal comprises an intermittent succession of pulses each of which is delayed from a transition time instant of the external clock signal by the particular time interval td. In the pulse generator 31, each pulse is a drop from a high level to a low level. The pulse width is defined as a time duration of the low level.

By selecting the particular time interval td and the pulse width tp at appropriate values, the datum $D(A_n)$ is supplied to the output latch circuit 32 during each pulse period, namely, during a time period in which the pulse signal has the low level. In other words, the pulse width and the particular time interval are determined so that the memory section MS newly outputs the particular datum during an appearance of one of the pulses.

Supplied with the pulse signal, the first output latch circuit 16 is put in the through mode during each pulse period. Thus, the datum $D(A_n)$ is transmitted to the output buffer circuit 18 to be delivered to the data output terminal 19 without any latency.

The pulse width tp is selected at an appropriate value (for example, shorter than the cycle time tcyc) so that the particular datum is continuously supplied to the first output latch circuit 16 during each pulse period without being replaced by a next datum. Thus, the output section OS performs the register operation. This is because the first output latch circuit 16 is put into the latching mode when the pulse signal is turned into the high level, and latches the particular datum until the pulse signal is turned into the low level after one cycle.

Thus, in correspondence to a leading edge of each clock in the external clock signal, the memory section MS continuously produces, as the particular datum, the datum stored at the address acquired at a leading edge of a previous clock one cycle. The particular datum is held until the next clock rises up. This operation is nothing but the register operation.

It is to be noted that the first output latch circuit 16 realizes the register operation as a single latch circuit in the output section OS. The time intervals t12 (=t2−t1) and t24 (=t4−t2) correspond to the time intervals t12 and t34 in Equation (3) in conjunction with the conventional synchronous semiconductor memory, respectively.

In the synchronous semiconductor memory of FIG. 4, the sum of the cycle time tcyc and the clock access time tca is given by:

$$tcyc + tca = t12 + t24 \qquad (7)$$

Comparing Equation (7) with Equation (6), it is understood that the timing margin t23 for securing the setup time of the third latch circuit 16 in the output section OS is omitted from Equation (7). Thus, the operation speed is increased correspondingly.

Practically, the time intervals t12 and t24 are equal to 6 ns and 2 ns, respectively. When the particular time interval td and the pulse width tp are equal to 5 ns and 2 ns, respectively, the cycle time tcyc and the clock access time tca are calculated to be 6 ns and 2 ns, respectively, which are shorter by 1ns than those in the conventional synchronous semiconductor memory. The sum of the cycle time tcyc and the clock access time tca is shorter by 2 ns.

As compared with the conventional synchronous semiconductor memory, one latch circuit is saved in the output section OS so as to reduce power consumption. The effect is remarkable in case of a multibit output signal where the latch circuits comprises an emitter coupled logic (ECL) known in the art. For example, a single latch circuit consumes an electric current of 1 mA. In this event, current consumption of 8 mA is saved in case of an eight-bit output signal.

As described above, the synchronous semiconductor memory of FIG. 4 comprises, as a register circuit in the output section OS, the single latch circuit and the pulse generator for producing the pulse signal synchronized with the clock signal for controlling the latch circuit. With this structure, it is possible to save the timing margin required in the conventional synchronous semiconductor memory to secure the setup time of the latch circuit in the output section OS. As a result, the sum of the cycle time tcys and the clock access time tca can be reduced as compared with the conventional synchronous semiconductor memory.

In addition, it is possible to save one latch circuit in the output section OS as compared with the conventional synchronous semiconductor memory and, as a consequence, to reduce the chip area. The sum of the cycle time tcyc and the clock access time tca is reduced, for example, from 8 ns in the conventional case to 6 ns in this embodiment. The difference of 2 nm corresponds to 25% reduction. The power consumption is reduced since one latch circuit in the output section OS is saved.

What is claimed is:

1. A synchronous semiconductor memory including a memory section for memorizing a particular datum, an input section for inputting said particular datum to said memory section, an output section for outputting said particular datum from said memory section, and control means responsive to an external clock signal for synchronously controlling operation of each of said input and said output sections, said control means comprising:

internal clock signal producing means responsive to said external clock signal for producing an internal clock signal delayed from said external clock signal;

control signal producing means connected to said internal clock signal producing means and responsive to said internal clock signal for producing an input section control signal which is used in controlling the operation of said input section; and pulse signal producing means connected to said internal clock signal producing means and responsive to said internal clock signal for producing a pulse signal synchronized with said internal clock signal, said pulse signal having a pulse width which is independent of said internal clock signal and which is determined dependent on a timing when said memory section outputs said particular datum;

said output section comprising a single output latch circuit which is connected to said memory section and said pulse signal producing means for controlling by the use of said pulse signal whether or not said particular datum is passed through said single output latch circuit.

2. A synchronous semiconductor memory as claimed in claim 1, wherein said pulse signal comprises an intermittent succession of pulses each of which is delayed from a transition time instant of said external clock signal by a particular time interval.

3. A synchronous semiconductor memory as claimed in claim 2, wherein said pulse width and said particular time interval are determined so that said memory section newly outputs said particular datum during an appearance of one of said pulses.

4. A synchronous semiconductor memory as claimed in claim 1, wherein said particular datum is passed as a local output datum through said single output latch circuit, said output section further comprising:

an output buffer circuit connected to said single output latch circuit for processing said local output datum into a buffered output datum; and a data output terminal connected to said output buffer for outputting said buffered output datum.

5. A synchronous semiconductor memory as claimed in claim 1, wherein said input section comprises:

a data input terminal supplied with an original datum;

an input buffer circuit connected to said data input terminal for processing said original datum into a buffered input datum which is delayed from said original datum to synchronize with said internal clock signal;

a first input latch circuit connected to said input buffer circuit for controlling by the use of a first input control signal as said input section control signal whether or not said buffered input datum is passed as a local input datum through said input first latch circuit; and a second input latch circuit connected to said input first latch circuit for controlling by the use of a second input control signal as said input section control signal whether or not said local input datum is passed as said particular datum through said second input latch circuit;

said control signal producing means comprising:

supplying means connected to said internal clock signal producing means and said first input latch circuit for supplying said internal clock signal as said first input control signal to said first input latch circuit; and inverting means connected to said internal clock signal producing means and said second input latch circuit for inverting said internal clock signal in its polarity to produce said second input control signal.

6. A synchronous semiconductor memory as claimed in claim 1, wherein said internal clock signal producing means comprises:

a clock signal input terminal for being supplied with said external clock signal; and a clock buffer circuit connected to said clock signal input terminal for processing said external clock signal into said internal clock signal that is delayed from said external clock signal.

* * * * *